United States Patent
Lin et al.

(10) Patent No.: US 8,653,555 B2
(45) Date of Patent: Feb. 18, 2014

(54) VERTICAL LIGHT-EMITTING DIODE

(75) Inventors: Xuejiao Lin, Xiamen (CN); Huijun Huang, Xiamen (CN)

(73) Assignee: Xiamen Sanan Optoelectronics Technology Co., Ltd., Xiamen (CN)

( * ) Notice: Subject to any disclaimer, the term of this patent is extended or adjusted under 35 U.S.C. 154(b) by 0 days.

(21) Appl. No.: 13/157,000

(22) Filed: Jun. 9, 2011

(65) Prior Publication Data

US 2011/0303895 A1   Dec. 15, 2011

(30) Foreign Application Priority Data

Jun. 10, 2010   (CN) .......................... 2010 1 0205490

(51) Int. Cl.
*H01L 33/00* (2010.01)

(52) U.S. Cl.
USPC 257/103; 257/93; 257/E33.012; 257/E33.001

(58) Field of Classification Search
USPC .................. 257/103, 93, E33.012, E33.001
See application file for complete search history.

(56) References Cited

U.S. PATENT DOCUMENTS

2007/0114564 A1* 5/2007 Lee et al. ................. 257/103
2011/0049540 A1* 3/2011 Wang et al. ................ 257/94

FOREIGN PATENT DOCUMENTS

WO   2009/117848 A1   10/2009

* cited by examiner

*Primary Examiner* — Julio J Maldonado
*Assistant Examiner* — Hajar Kolahdouzan
(74) *Attorney, Agent, or Firm* — Maschoff Brennan

(57) ABSTRACT

A vertical light-emitting diode with a short circuit protection function includes a heat dissipation substrate, a second electrode, a welding metal layer and a third electrode; a semiconductor light-emitting layer formed on the third electrode; a barrier for the semiconductor light-emitting layer with an isolation trench, so that the barrier for the semiconductor light-emitting layer surrounds the semiconductor light-emitting layer on a central region of the third electrode, with the isolation trench therebetween. The barrier for the semiconductor light-emitting layer has a structure the same as the semiconductor light-emitting layer, and the isolation trench exposes the third electrode. A fourth electrode is formed on the semiconductor light-emitting layer. The barrier prevents the metal particles in chip dicing and the conductive adhesive in packaging from reaching the semiconductor light-emitting layer, thereby providing short circuit protection and improving the reliability of the vertical light-emitting diode.

7 Claims, 2 Drawing Sheets

VERTICAL LIGHT-EMITTING DIODE

FIELD OF INVENTION

The present invention relates to a vertical light-emitting diode, and particularly to a vertical light-emitting diode with a short circuit protection function.

BACKGROUND OF THE INVENTION

Nowadays, most of the GaN-based light-emitting diodes have an epitaxial layer grown on a sapphire substrate. Sapphire has a low electrical conductivity, and the GaN-based light-emitting devices normally have a lateral structure in which both electrodes are on the same side of the device. The lateral current paths through the n-GaN layer are different in length, resulting in current blocking and decreased light-emitting device reliability. Sapphire also has a low thermal conductivity, which may limit the light-emission power and efficiency of the GaN-based light-emitting devices. Consequently, problems concerning heat dissipation, light emission and static electricity reducing can be solved by removing the sapphire substrate and forming the light-emitting devices with a vertical structure.

In a vertical light-emitting diode, an n-type conductive layer serves as an upper light-emitting surface; and a p-type conductive layer servers as a lower light-emitting surface and is welded on a heat dissipation substrate through conductive metal. The p-type conductive layer normally has a small thickness, approximately 200-800 nm; hence the distance between the active layer formed on the p-type conductive layer and the conductive metal on the heat dissipation substrate is small. The heat dissipation substrate, in some cases, may even be a metal substrate, e.g., Mo, Cu or WCu. Therefore, for example, in the process of chip dicing, generated metal particles may be splashed to the sidewall of the quantum well light-emitting layer, causing electricity leakage and ineffectiveness of the light-emitting diode; in the process of packaging, the conductive adhesive may extend to the light-emitting layer, causing electricity leakage and ineffectiveness of the light-emitting diode; and in the process of chip handling, the light-emitting layer may be damaged, also causing electricity leakage. In order to prevent the vertical light-emitting diode from the problems above to avoid short circuit, insulating materials such as $SiO_2$ are used in the prior art to protect the sidewall of the light-emitting layer.

FIG. 1a and FIG. 1b illustrate a conventional vertical light-emitting diode structure. A heat dissipation substrate 10 is formed on a first electrode at the bottom, and the heat dissipation substrate 10 can be made of any one of the materials of: GaAs, Ge, Si, Mo, Cu, and WCu. A second electrode 12 is formed on the heat dissipation substrate 10. Welding metal 13 is formed on the second electrode 12. A third electrode 14 is formed at a central region on the welding metal 13. A semiconductor light-emitting layer 20 is formed on the third electrode 14, and the semiconductor light-emitting layer includes an n-type conductive layer made of GaN, an active layer made of InGaN, a p-type limiting layer made of InGaN or AlGaN, and a p-type conductive layer made of GaN. A fourth electrode 15 is formed on the semiconductor light-emitting layer 20. An electrical insulating layer 16 is formed on the edges of the upper surface of the semiconductor light-emitting layer 20 and extends to its sidewall; the electrical insulating layer can be made of any one of the materials of: SiO2, SiN and Al2O3. The vertical light-emitting diode in the prior art is characterized in that: short circuit protection is based on the electrical insulating material e.g. $SiO_2$, SiN or $Al_2O_3$; however it has the drawbacks that: the insulating film of e.g. $SiO_2$ is normally formed on the surface and sidewall of the semiconductor light-emitting layer by plasma-enhanced chemical vapor deposition (PECVD) at a certain temperature, due to the large stress inside the deposited $SiO_2$ film and its poor adhesiveness to the semiconductor light-emitting layer, the $SiO_2$ film may easily split or fall off, failing the purpose of short circuit protection.

SUMMARY OF THE INVENTION

To solve the problems in the prior art that the vertical light-emitting diode may lose short circuit protection and the resulting decreased reliability because the $SiO_2$ insulating film is easy to split or fall off, the present invention provides a new vertical light-emitting diode with a short circuit protection function.

According to the present invention, a vertical light-emitting diode includes:

a heat dissipation substrate;

a first electrode, formed on a surface of the heat dissipation substrate;

a second electrode, formed on the other surface of the heat dissipation substrate;

a welding metal layer, formed on the second electrode;

a third electrode, formed on the welding metal layer;

a semiconductor light-emitting layer, formed on a central region of the third electrode, for emitting light;

a barrier for the semiconductor light-emitting layer, formed on a peripheral region of the third electrode, wherein, the barrier surrounds the semiconductor light-emitting layer with an isolation trench therebetween, the isolation trench exposes the third electrode at its bottom; and the barrier has a structure the same as the semiconductor light-emitting layer; and a fourth electrode, formed on the semiconductor light-emitting layer.

The barrier for the semiconductor light-emitting layer is an innovation by the present invention. The barrier for the semiconductor light-emitting layer may be formed by removing a portion of a semiconductor light-emitting layer through etching to generate an isolation trench. The barrier for the semiconductor light-emitting layer surrounds the semiconductor light-emitting layer, and can effectively prevent the metal particles in chip dicing and the conductive adhesive in packaging from reaching the semiconductor light-emitting layer, thereby providing short circuit protection for the semiconductor light-emitting layer and improving the reliability of the vertical light-emitting diode according to the present invention.

In the present invention, the fabrication material for the heat dissipation substrate may be any one or more of: GaAs, Ge, Si, Mo, Cu and WCu; the semiconductor light-emitting layer may include: a semiconductor layer of a first conductivity type made of GaN, an active layer made of InGaN, a limiting layer of a second conductivity type made of InGaN or AlGaN, and a semiconductor layer of a second conductivity type made of GaN; the isolation trench between the semiconductor light-emitting layer and the barrier for the semiconductor light-emitting layer may be formed by etching, i.e. by etching a peripheral region of a semiconductor light-emitting layer such that the underlying third electrode is exposed, thereby the barrier for the semiconductor light-emitting layer surrounds the semiconductor light-emitting layer with a distance therebetween, and the barrier for the semiconductor light-emitting layer has a structure the same as the semiconductor light-emitting layer.

The present invention has the advantages that: the barrier for the semiconductor light-emitting layer surrounds the semiconductor light-emitting layer with a distance therebetween, and can effectively prevent the metal particles in chip dicing and the conductive adhesive in packaging from reaching the semiconductor light-emitting layer, thereby providing short circuit protection for the semiconductor light-emitting layer and improving the reliability of the vertical light-emitting diode according to the present invention.

BRIEF DESCRIPTION OF THE DRAWINGS

FIG. 1b is a sectional view taken along line A-A of FIG. 1a.

DETAILED DESCRIPTION OF THE INVENTION

The present invention will be further described hereinafter in conjunction with the accompanying drawings and the embodiments.

Figure 1A:
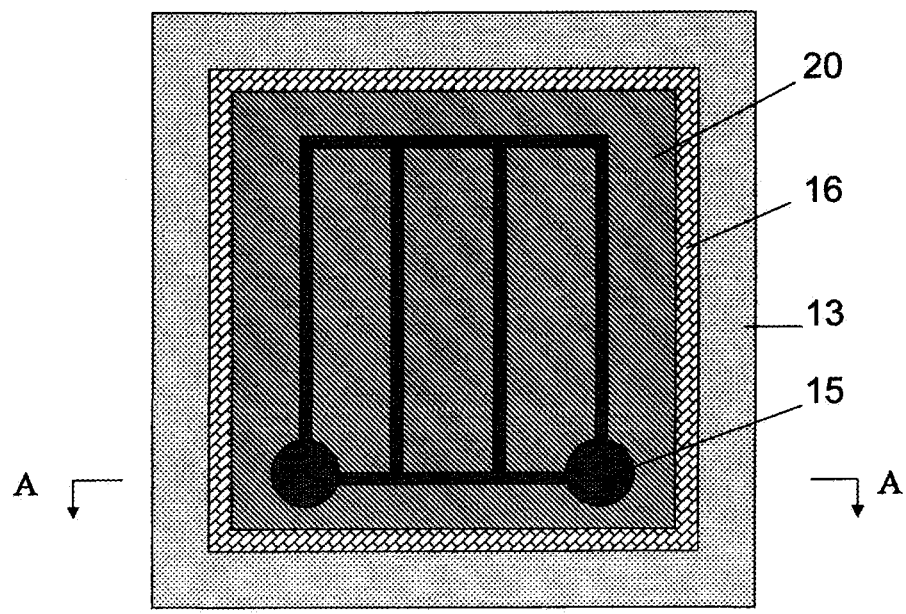
FIG. 1a is a top view of a vertical light-emitting diode in the prior art.
Figure 1B:
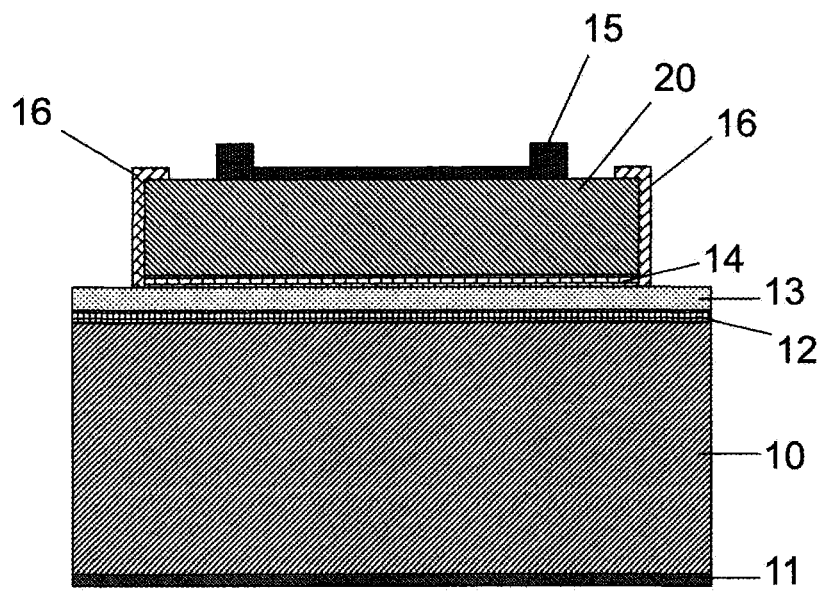
Figure 2A:
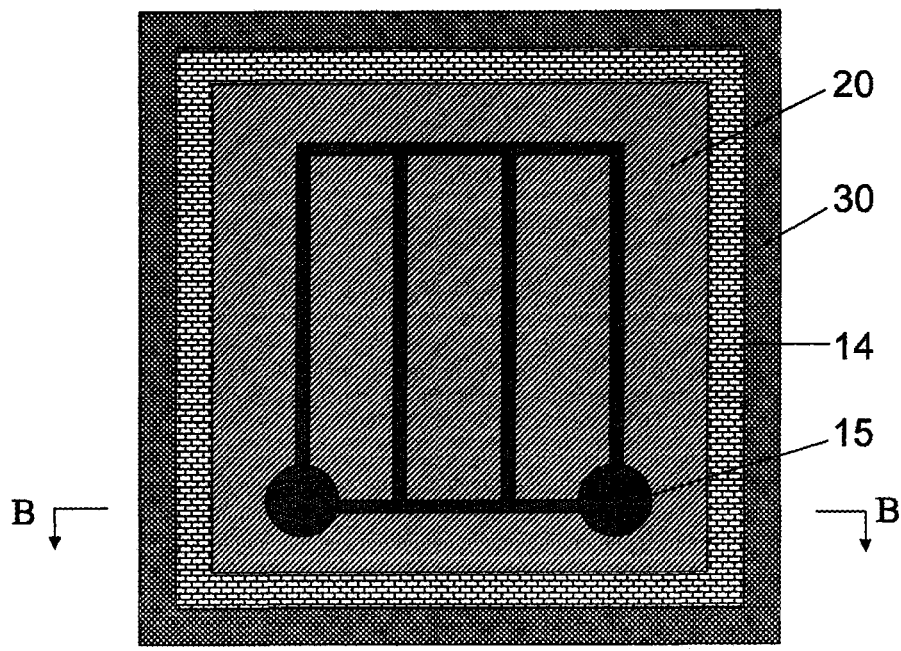
FIG. 2a is a top view of a vertical light-emitting diode with a short circuit protection function according to the present invention.
Figure 2B:
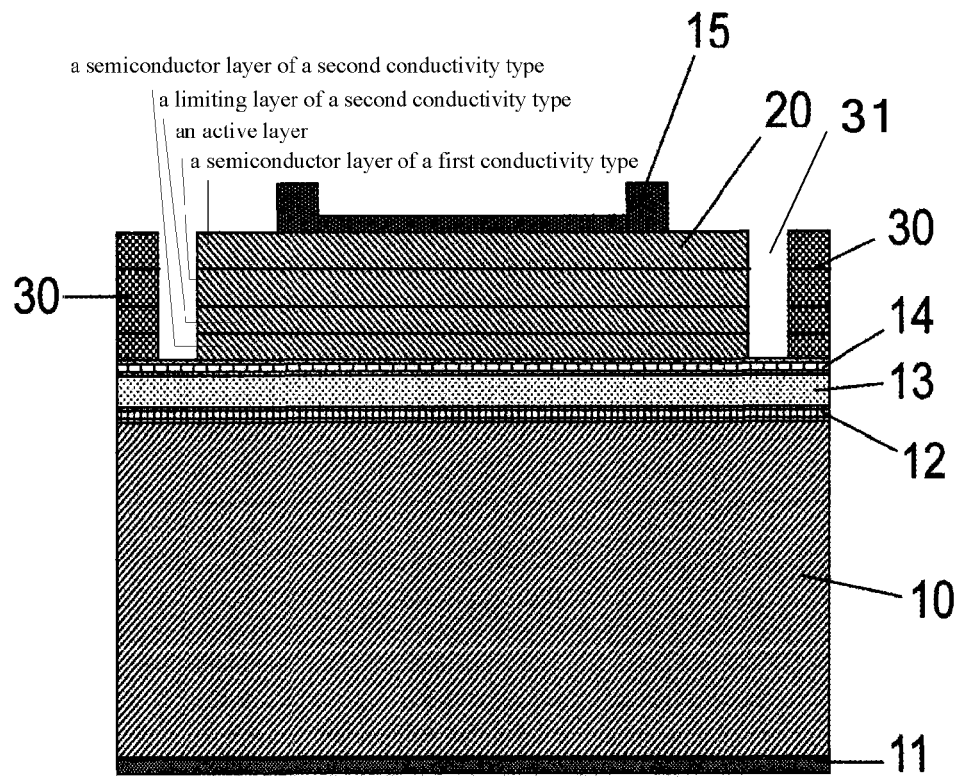
FIG. 2b is a sectional view taken along line B-B of FIG. 2a.
In the accompanying drawings:
10: heat dissipation substrate; 11: first electrode;
12: second electrode; 13: welding metal layer;
14: third electrode; 15: fourth electrode;
16: electrical insulating layer; 20: semiconductor light-emitting layer;
30: barrier for the semiconductor light-emitting layer; 31: isolation trench.

FIG. 2a and FIG. 2b illustrate a vertical light-emitting diode with a short circuit protection function. A first electrode 11 is formed on a bottom of a heat dissipation substrate 10 made of GaAs. A second electrode 12 is formed on the heat dissipation substrate 10. A third electrode 14 is formed on the welding metal layer 13. A semiconductor light-emitting layer 20 is formed on the third electrode 14. The welding metal layer 13 is formed on the second electrode 12. The semiconductor light-emitting layer 20 is formed at a central region on the third electrode 14. The semiconductor light-emitting layer 20 includes: an n-type conductive layer made of GaN, an active layer made of InGaN, a p-type limiting layer made of AlGaN, and a p-type conductive layer made of GaN. The semiconductor light-emitting layer 20 provides the light emitting function. A fourth electrode 15 is formed on the semiconductor light-emitting layer 20. A barrier 30 for the semiconductor light-emitting layer is formed on the third electrode 14 at a peripheral region of the third electrode 14. The barrier 30 for the semiconductor light-emitting layer surrounds the semiconductor light-emitting layer 20 with a certain distance therebetween. The barrier 30 for the semiconductor light-emitting layer has a structure the same as that of the semiconductor light-emitting layer 20. Between the semiconductor light-emitting layer and the barrier for the semiconductor light-emitting layer, is an isolation trench 31. At the bottom of the isolation trench 31, is the third electrode 14; that is, the third electrode 14 is exposed between the barrier 30 for the semiconductor light-emitting layer and the semiconductor light-emitting layer 20. In terms of fabrication, the barrier 30 for the semiconductor light-emitting layer according to the present invention can be formed by: removing a portion of a bare semiconductor light-emitting layer 20 on the third electrode 14 to generate an isolation trench 31. The barrier 30 for the semiconductor light-emitting layer provides short circuit protection for the semiconductor light-emitting layer 20. Therefore, the vertical light-emitting diode according to the present invention has a short circuit protection function and improved reliability.

The invention claimed is:
1. A vertical light-emitting diode, comprising:
a heat dissipation substrate;
a first electrode, formed on a surface of the heat dissipation substrate;
a second electrode, formed on the other surface of the heat dissipation substrate;
a welding metal layer, formed on the second electrode;
a third electrode, formed on the welding metal layer;
a semiconductor light-emitting layer, formed on a central region of the third electrode, for emitting light;
a barrier for the semiconductor light-emitting layer, formed on a peripheral region of the third electrode, wherein, the barrier surrounds the semiconductor light-emitting layer, an isolation trench is provided between the barrier and the semiconductor light-emitting layer to isolate the semiconductor light-emitting layer from the barrier fully, the isolation trench exposes the third electrode at its bottom; and the barrier has a structure the same as the semiconductor light-emitting layer; and
a fourth electrode, formed only on the semiconductor light-emitting layer.
2. The vertical light-emitting diode according to claim 1, wherein, the fabrication material for the heat dissipation substrate is any one or more of: GaAs, Ge, Si, Mo, Cu, and WCu.
3. The vertical light-emitting diode according to claim 1, wherein, the isolation trench between the semiconductor light-emitting layer and the barrier for the semiconductor light-emitting layer is formed by etching.
4. The vertical light-emitting diode according to claim 1, wherein, the semiconductor light-emitting layer comprises: a semiconductor layer of a first conductivity type, an active layer, and a semiconductor layer of a second conductivity type, which are stacked in that order.
5. The vertical light-emitting diode according to claim 4, wherein, the barrier for the semiconductor light-emitting layer comprises:
a semiconductor layer of a first conductivity type, made of at least GaN;
an active layer made of at least InGaN; and
a semiconductor layer of a second conductivity type, made of at least GaN, and wherein, the barrier for the semiconductor light-emitting layer further comprises:
a limiting layer of the second conductivity type, formed between the active layer and the semiconductor layer of the second conductivity type, the limiting layer of the second conductivity type being made of InGaN or AlGaN.
6. The vertical light-emitting diode according to claim 1, wherein, the barrier for the semiconductor light-emitting layer comprises:
a semiconductor layer of a first conductivity type, made of at least GaN;
an active layer made of at least InGaN; and
a semiconductor layer of a second conductivity type, made of at least GaN, and wherein, the barrier for the semiconductor light-emitting layer further comprises:
a limiting layer of the second conductivity type, formed between the active layer and the semiconductor layer of the second conductivity type, the limiting layer of the second conductivity type being made of InGaN or AlGaN.

7. The vertical light-emitting diode according to claim 3, wherein, the barrier for the semiconductor light-emitting layer comprises:
- a semiconductor layer of a first conductivity type, made of at least GaN;
- an active layer made of at least InGaN; and
- a semiconductor layer of a second conductivity type, made of at least GaN, and wherein, the barrier for the semiconductor light-emitting layer further comprises:
- a limiting layer of the second conductivity type, formed between the active layer and the semiconductor layer of the second conductivity type, the limiting layer of the second conductivity type being made of InGaN or AlGaN.

* * * * *